(12) United States Patent
Bradler et al.

(10) Patent No.: US 11,101,624 B2
(45) Date of Patent: Aug. 24, 2021

(54) SWITCHING DEVICE COMPRISING LASHING POINTS

(71) Applicant: SIEMENS AKTIENGESELLSCHAFT, Munich (DE)

(72) Inventors: Christian Bradler, Berlin (DE); Hans-Peter Dambietz, Berlin (DE); Ulrike Ehrlich, Hohen Neuendorf Ot Bergfelde (DE); Peter Fahlbusch, Berlin (DE); Sven Grohall, Berlin (DE); Anne Hertel, Berlin (DE); Dan Ludenia, Schoenwalde-Siedl (DE); Alexander Rose-Poetzsch, Panketal (DE); Patrick Schlieder, Schoenwalde-Glien (DE); Anne Schmidt, Berlin (DE); Andre Schomacher, Glienicke/Nordbahn (DE); Ai Guang Zhao, Berlin (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 16/643,046

(22) PCT Filed: Aug. 20, 2018

(86) PCT No.: PCT/EP2018/072384
§ 371 (c)(1),
(2) Date: Feb. 28, 2020

(87) PCT Pub. No.: WO2019/042798
PCT Pub. Date: Mar. 7, 2019

(65) Prior Publication Data
US 2020/0212660 A1   Jul. 2, 2020

(30) Foreign Application Priority Data
Aug. 28, 2017 (DE) .......................... 102017214970

(51) Int. Cl.
*H02B 1/04* (2006.01)
*H02B 13/00* (2006.01)
(Continued)

(52) U.S. Cl.
CPC .......... *H02B 13/045* (2013.01); *H02B 1/041* (2013.01); *H02B 1/54* (2013.01); *H02B 13/0356* (2013.01); *H05K 7/18* (2013.01)

(58) Field of Classification Search
None
See application file for complete search history.

(56) References Cited

U.S. PATENT DOCUMENTS 6,317,311 B1 * 11/2001 Middlehurst .......... H02B 1/056
361/637
6,680,842 B1 * 1/2004 Pelaez ................ H01H 11/0031
361/631

(Continued)

FOREIGN PATENT DOCUMENTS

CN        202423884 U     9/2012
CN        204187177 U     3/2015
(Continued)

OTHER PUBLICATIONS

"Gas-insulated switchgear type series 8DN8 up to 170 kV, 63 kA, 4000 A" Siemens AG Published by and copyright 2012; Siemens AG Energy Sector www.siemens.com/energy; 2012.

*Primary Examiner* — Courtney L Smith
(74) *Attorney, Agent, or Firm* — Laurence Greenberg; Werner Stemer; Ralph Locher

(57) ABSTRACT

A switching device has an encapsulation housing and lashing points. The lashing points are arranged in such a manner that a center of gravity of the switching device lies below the lashing points in a lashing direction.

18 Claims, 3 Drawing Sheets

(51) Int. Cl.
*H02B 13/045* (2006.01)
*H02B 1/54* (2006.01)
*H05K 7/18* (2006.01)
*H02B 13/035* (2006.01)

(56) References Cited

U.S. PATENT DOCUMENTS

| | | | | |
|---|---|---|---|---|
| 6,992,256 | B1* | 1/2006 | Wiley | H01H 3/48 |
| | | | | 200/321 |
| 7,286,340 | B2* | 10/2007 | Karim | H02B 1/042 |
| | | | | 200/294 |
| 7,414,828 | B2* | 8/2008 | Birner | H02B 1/056 |
| | | | | 361/624 |
| 7,813,110 | B1* | 10/2010 | Rezac | H02B 1/056 |
| | | | | 361/624 |
| 9,293,282 | B2* | 3/2016 | Schaltenbrand | H01H 9/32 |
| 10,096,978 | B2* | 10/2018 | Luoma | H02B 1/32 |
| 10,181,384 | B2* | 1/2019 | Faulkner | H01H 33/52 |
| 10,247,331 | B1* | 4/2019 | Specht | H02B 1/50 |
| 10,250,017 | B2* | 4/2019 | Bastian | H01R 25/145 |
| 2005/0035835 | A1* | 2/2005 | Liebetruth | H01H 1/226 |
| | | | | 335/16 |

FOREIGN PATENT DOCUMENTS

| | | |
|---|---|---|
| CN | 205187625 U | 4/2016 |
| CN | 105896328 A | 8/2016 |
| CN | 205673135 U | 11/2016 |
| CN | 206093170 U | 4/2017 |
| EP | 0 690 538 A2 | 1/1996 |
| JP | 2017121122 A | 7/2017 |

* cited by examiner

SWITCHING DEVICE COMPRISING LASHING POINTS

BACKGROUND OF THE INVENTION

Field of the Invention

The invention relates to a switchgear having an enclosure housing and anchoring points.

A switchgear with an enclosure housing is revealed in the brochure "Gas-insulated switchgear type series 8DN8". The switchgear has a supporting frame on which anchoring points for fastening the switchgear are arranged. It is therefore possible to connect the switchgear directly to a foundation. However, it is disadvantageous that the overall height is increased by the supporting frame. This can hinder transportation. Furthermore, increased breaking forces can act on the switchgear, in particular when used in regions prone to earthquakes. Mechanical reinforcements must be provided accordingly for these applications.

SUMMARY OF THE INVENTION

It is therefore an object of the invention to provide a switchgear which has better stability with a reduced overall height.

The object is achieved in an above-mentioned switchgear in that the anchoring points are arranged such that the center of gravity of the switchgear is located below the anchoring points in the anchoring direction.

A switchgear is a device for switching a current path. The current path to be switched is preferably arranged at least partially in the interior of an enclosure housing. As such, the enclosure housing forms a mechanical barrier for the sections of the current path to be switched which are arranged in its interior. By way of example, circuit breakers, cut-off switches, load switches, grounding switches etc. can be used as the switchgear. Mutually relatively movable switching contacts can be used for switching the current path.

Anchoring points are points on the switchgear at which forces for securing the latter can be introduced. A secured state can be realized both temporarily and permanently by way of the anchoring points. By way of example, eyes, threaded bores, cutouts, projections, hooks etc. can serve as anchoring points.

It is possible to load the switchgear in an anchoring direction by way of the anchoring points. The anchoring direction is determined by the sum of the forces which act on the switchgear. The anchoring direction is preferably located in a vertical direction. In this case, the center of gravity of the switchgear is preferably located below an area which is surrounded by the anchoring points, as seen in the anchoring direction. The center of gravity is preferably located between the anchoring points and a counter-bearing (e.g. mounting surface) for the anchoring forces. Accordingly, in an anchoring operation, i.e. when bracing the switchgear against a mounting surface, the position of the switchgear can be additionally stabilized by the center of gravity. In this case, the mounting surface is located transversely to the anchoring direction so that the mounting surface can act as a counter-bearing for forces acting in the anchoring direction. The mounting surface can preferably be aligned substantially perpendicularly to the anchoring direction. The anchoring points can be located approximately in a plane which extends substantially parallel to a mounting surface. The arrangement of the anchoring points above the center of gravity furthermore has the advantage that the anchoring points can also be used as crane points. A stable position is therefore assumed when the switchgear is suspended at the anchoring points. It is thus possible to alter the load on the anchoring points in a simple manner without risking the stability of the switchgear.

A further advantageous configuration can provide that the enclosure housing has a flange, beyond the circumference of which the anchoring points project.

Access to the interior of the enclosure housing is possible by means of a flange. The flange can also be closed accordingly by way of a flange cover. The flange can be designed as an annular flange, for example. The flange delimits a flange opening. The anchoring points can project beyond the flange at the circumference of the flange. Exposed points are thus formed, on which anchoring forces can act. The anchoring points can be arranged substantially diametrically opposite one another, for example. The anchoring points are preferably kept free from being covered by a flange cover closing the flange. The flange can be a flat face flange, for example, beyond the flat face of which anchoring points project substantially in the radial direction. The anchoring points can merge at least partially into the flange. A force distribution into the flange is therefore possible in a simple manner. The center of gravity of the switching system can be spanned by the flange.

It can furthermore be advantageously provided that the anchoring points are arranged axially offset with respect to the flange.

As a result of an axial offset, it is possible for forces for the anchoring operation to be introduced into the enclosure housing below the flange. It is thus possible to separate the flange and the anchoring point, whilst forces can still act in the same region of the enclosure housing.

It can furthermore be provided that add-on parts are supported laterally on the enclosure housing, between two anchoring points.

Add-on parts can be supported on the enclosure housing. For example, control boxes, drive housings, etc. can therefore be fastened to the enclosure housing. Extending between two anchoring points is a linear connecting axis, to which planes which are aligned substantially parallel to one another and at a right angle to the linear connecting axis extend. Each of the planes extends through a respective anchoring point. The two planes delimit the space in which add-on parts can be arranged laterally on the enclosure housing. It is thus possible to fasten brackets comprising add-on parts to the enclosure housing, which adjoin the enclosure housing laterally such that they are delimited between the planes. In particular, the anchoring points can still project beyond the flange. In this case, it can be provided in particular that, transversely to the reach of the lateral sides of the add-on parts (in the direction of the connecting axis), the flange has a greater extent than the add-on parts, or at least the same extent as the add-on parts. The anchoring points can be used accordingly to realize a relaxing or tightening of fastening means both parallel to the planes between which the add-on parts extend and perpendicularly to these planes (in the direction of the connecting axis).

It can furthermore advantageously be provided that add-on parts are arranged laterally on the enclosure housing on opposite sides of the enclosure housing, in each case between two anchoring points.

A respective linear connecting axis can extend between two anchoring points in each case. The connecting axes should preferably be arranged substantially parallel to one another, in each case between two anchoring points between which the add-on parts are each located on opposite sides of the enclosure housing. The add-on parts can accordingly each protrude laterally from the enclosure housing, substantially perpendicularly to these axes. Add-on parts located on both sides of the enclosure housing can therefore be arranged in alignment with one another. A reach of the anchoring points in the direction of alignment of the add-on parts should advantageously be realized in each case such that, with respect to the planes (perpendicular to the connecting axis, extending through the anchoring points) which, in parallel, delimit the add-on parts in the direction of alignment, perpendicular or parallel bracing is possible by way of the respective anchoring points.

In this case, it can advantageously be provided that the add-on parts extend beyond the anchoring points in the anchoring direction.

The center of gravity of the switchgear is located below the anchoring points in the anchoring direction. When the add-on parts extend beyond the anchoring points, additional installation space can be used for the add-on parts, wherein it is possible also to anchor or stabilize the switchgear at the anchoring points. In the anchoring direction, an extension can be realized in both directions as well as only in one direction. In this case, the add-on parts are arranged such that the center of gravity of the switchgear is still located below the anchoring points. In this case, it is not intended for the anchoring points to be covered by add-on parts in the direction of the axis of the center of gravity. The anchoring points are therefore freely accessible, in particular above the center of gravity, whereby it is possible to also use the anchoring points for moving the switchgear with a crane.

A further advantageous configuration can provide that the flange forms an end-face termination of the enclosure housing above a mounting surface.

Above a mounting surface against which an anchoring of the switchgear can be realized using the anchoring points, an end-face termination of the enclosure housing can be realized by way of a flange. In this case, the flange can be closed (possibly in a fluid-tight manner) by means of a suitable flange cover. By way of the end-face termination of the enclosure housing, it is ensured that no further enclosure-housing parts are situated above the end-face termination. Suitable access to the anchoring points should therefore also be enabled from the direction of the flange and from radial directions to the flange.

A further advantageous configuration can provide that the flange is closed by a gear cover.

A gear cover can serve to close a flange. Introducing a movement into the interior of the enclosure housing is enabled by means of the gear cover. The movement can therefore be generated outside the enclosure housing, for example, and transmitted into the interior of the enclosure housing by passing through the gear cover. It is thus furthermore possible to introduce a movement into the interior of the enclosure housing in a leak-tight manner.

The gear cover can be penetrated by a rotatable shaft or an axially movable rod, for example. In this case, penetration of the gear cover can be realized in a fluid-tight manner so that the gear cover can also be part of a fluid-tight barrier.

In this case, it can be furthermore advantageously provided that a drive device for mutually relatively movable switching contacts of the switchgear is supported on the flange.

A drive device can serve to induce a relative movement of mutually relatively movable switching contacts of the switchgear which are preferably situated in the interior of the enclosure housing. In this case, the drive device can be held at least partially on the flange. For example, the drive device can be supported on the flange, with the interconnection of the gear cover.

It can advantageously furthermore be provided that the enclosure housing is a pressurized vessel.

The enclosure housing can be formed as a pressurized vessel. As such, the interior of the enclosure housing can be subjected to a positive pressure or negative pressure. To this end, the enclosure housing, as such, is formed to be fluid-tight. For example, the interior of the enclosure housing can be filled with an electrically insulating fluid, with which insulation of mutually movable switching contacts of the switchgear is realized. Moreover, the electrically insulating fluid can also electrically insulate passive components, such as phase conductors, voltage converters and the like. By way of example, fluorine-containing media, such as sulfur hexafluoride, fluoronitrile, fluoroketone and nitrogen-containing media, such as nitrogen, purified atmospheric air etc. can be used as electrically insulating fluids. In addition to the use of gaseous fluids, use of liquid insulating media is also permissible. To be able to withstand a pressure difference, the enclosure housing has an appropriate mechanical stability. This mechanical stability can be used to support add-on parts on the enclosure housing. Anchoring points can be arranged on the surface of the enclosure housing and project from the enclosure housing or the surface thereof. Add-on parts themselves are kept clear of anchoring points. The add-on parts themselves do not necessarily have to be realized as pressurized vessels.

An exemplary embodiment of the invention is shown schematically in a drawing below and described in more detail below.

DETAILED DESCRIPTION OF THE INVENTION

Figure 1:
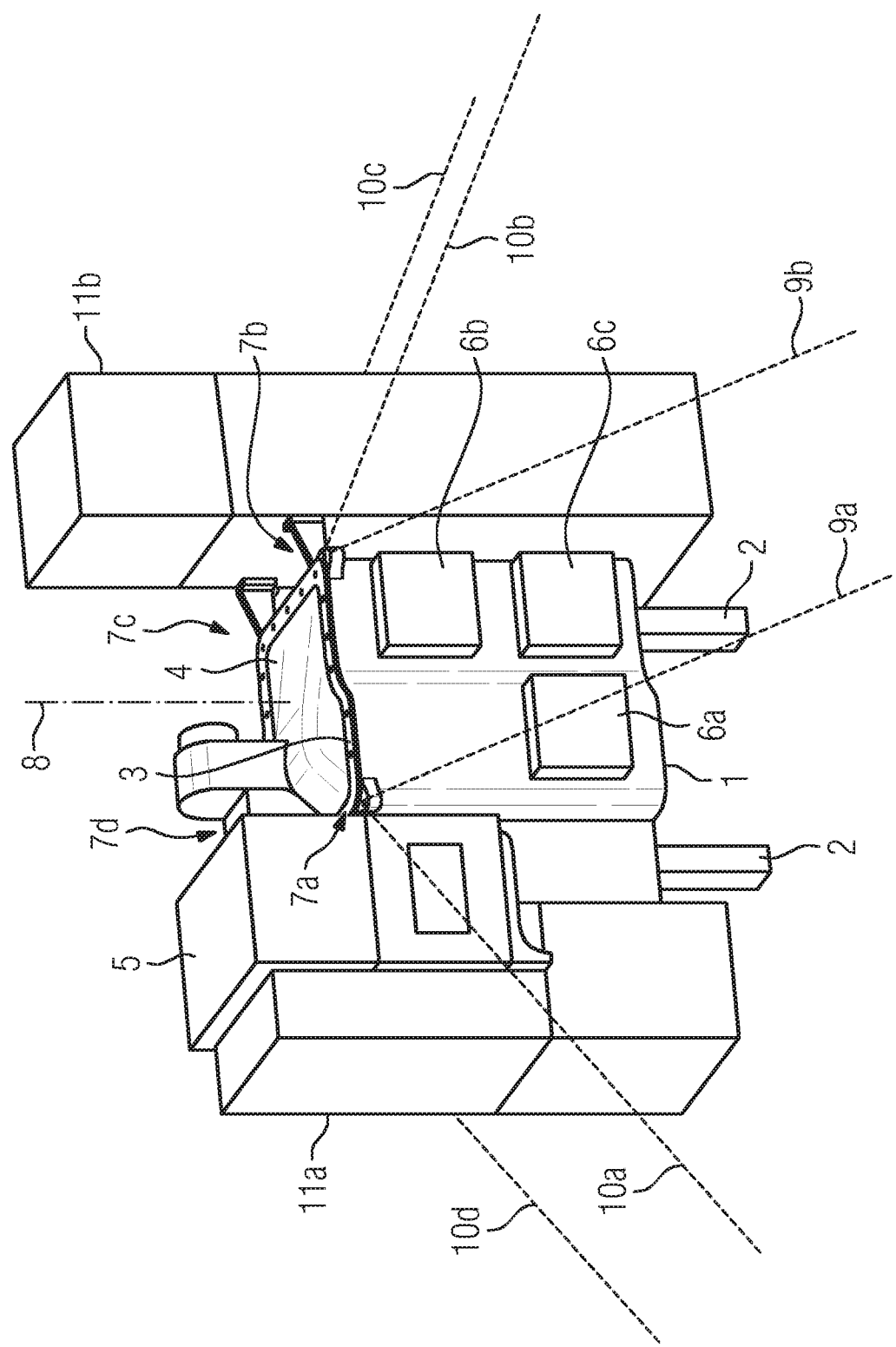
FIG. 1 a perspective view of a switchgear.

The switchgear in FIG. 1 has an enclosure housing 1. The enclosure housing 1 is formed as a pressurized vessel in the present case and receives mutually relatively movable switching contacts of the switchgear in its interior. Electrical integration of the switchgear in an electrical network can be realized by way of bushings, for example, which are embedded in a wall of the enclosure housing 1. Cables can be connected there by means of plug connectors, for example. Bushings can be surrounded by add-on parts 11a, 11b, for example, so that mechanical protection is realized by the add-on parts 11a, 11b. The interior of the enclosure housing 1 is filled with an electrically insulating fluid under positive pressure. This is preferably a fluorine-containing fluid such as sulfur hexafluoride, fluoronitrile, fluoroketone or a nitrogen-containing fluid, such as nitrogen and nitrogen mixtures, such as purified atmospheric air. The enclosure housing 1 is arranged upright and supported against a mounting surface 2. Remote from the mounting surface 2, the enclosure housing 1 has a flange 3 at its end face. The flange 3 has an irregular polygonal structure (c.f. also the plan view in FIG. 2). The flange 3 is closed by a flange cover 4. In this case, the flange cover 4 is connected to the flange 3 in a fluid-tight manner so that the electrically insulating fluid arranged in the interior of the enclosure housing is prevented from escaping. The flange cover 4 is formed as a gear cover in the present case, i.e., in an integral structure, introducing a movement into the interior of the enclosure housing 1 is enabled via gear elements, such as shafts or rods, for example. In this case, a transmission into the interior of the enclosure housing 2 is realized in a preferably fluid-tight manner. To generate a movement, a drive device 5 is fastened to the gear cover. The drive device 5 is arranged offset with respect to the flange 3. However, it can also be provided that the drive device 5 extends at least partially beyond the flange 3.

Three further drive devices 6a, 6b, 6c are arranged laterally on the enclosure housing 1. By way of the further drive devices 6a, 6b, 6c, further movements can be coupled in a fluid-tight manner into the interior of the enclosure housing 1 (e.g. for grounding switches, cut-off switches, etc.). A first anchoring point 7a, a second anchoring point 7b, a third anchoring point 7c and a fourth anchoring point 7d are arranged at the circumference of the flange 3. Only the first anchoring point 7a and the second anchoring point 7b are directly visible in the perspective view according to FIG. 1. The third anchoring point 7c and the fourth anchoring point 7d are covered by body edges in FIG. 1.

Figure 2:
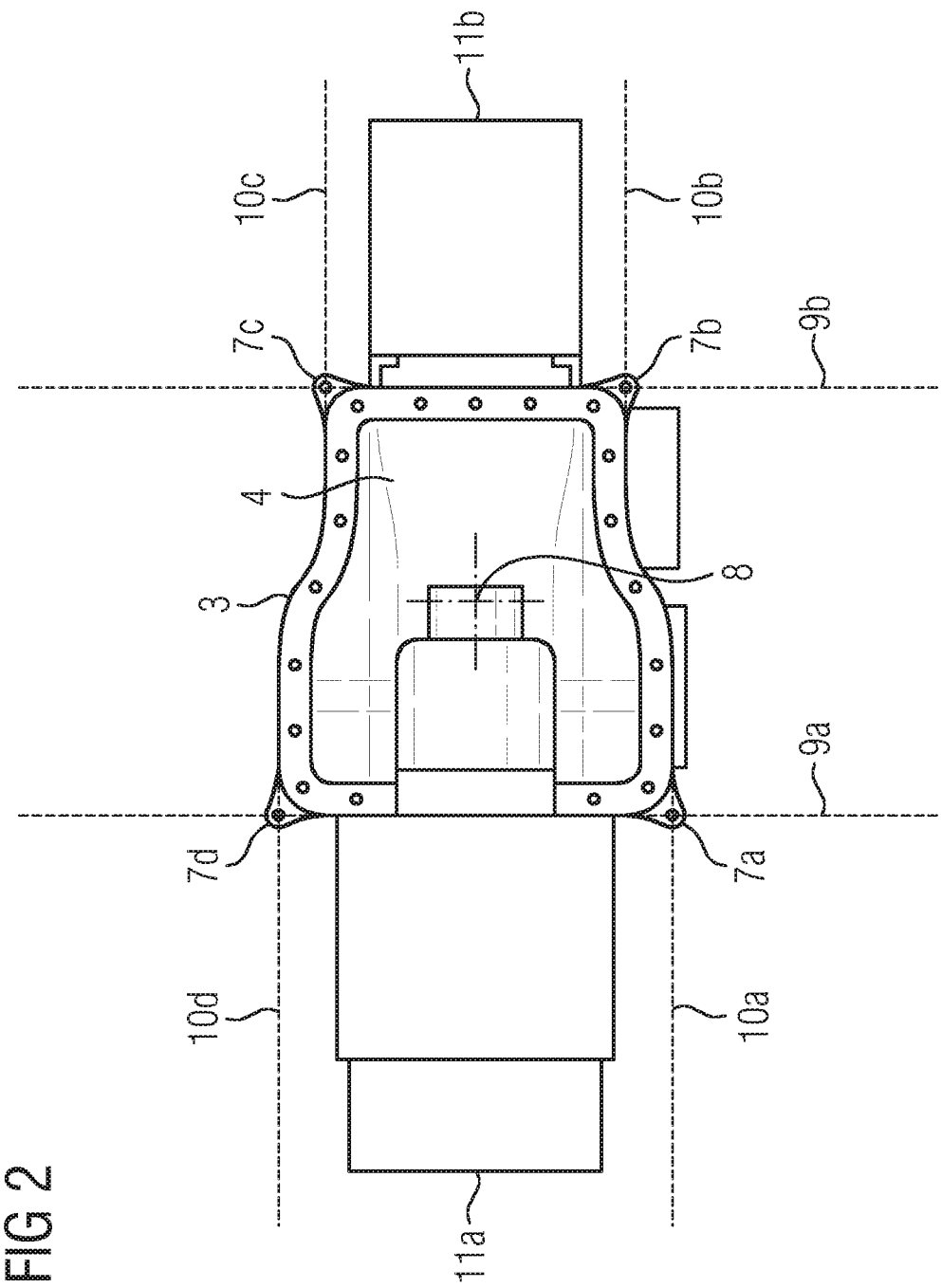
FIG. 2 a plan view of the switchgear as known from FIG. 1.

All four anchoring points 7a, 7b, 7c, 7d are visible in the plan view of FIG. 2. The anchoring points 7a, 7b, 7c, 7d project beyond the circumference of the flange 3 so that the anchoring points 7a, 7b, 7c, 7d are not covered by the flange 3 or the flange cover 4 in the direction of a center-of-gravity axis 8. The center-of-gravity axis 8 corresponds substantially to an anchoring direction. The circumferential extent of the anchoring points 7a, 7b, 7c delimits an area below which the center of gravity of the switchgear is located in the direction of the center-of-gravity axis 8. Accordingly, in relation to the mounting surface 2, anchoring points 7a, 7b, 7c, 7d are arranged above the center of gravity of the switchgear.

Two of the anchoring points 7a, 7d and 7b, 7c in each case are connected to one another via a connecting axis 9a, 9b. The connecting axes 9a, 9b are aligned substantially parallel to one another. In this case, the spacing of the first anchoring point 7a from the fourth anchoring point 7d has a greater value in the direction of the connecting axis 9a than the spacing of the second anchoring point 7b from the third anchoring point 7c in the direction of the associated connecting axis 9b. Accordingly, axes which are each located in a plane 10a, 10b, 10c, 10d are produced substantially perpendicularly to the connecting axes 9a, 9b, starting from the respective anchoring points 7a, 7b, 7c, 7d. On opposite sides of the enclosure housing 1, the planes 10a, 10b, 10c, 10d laterally delimit regions within which add-on parts 11a, 11b are laterally connected to the enclosure housing 1. The add-on parts 11a, 11b are at least partially supported on the enclosure housing 1. By way of example, the drive device 5 can also be formed as an add-on part 11a, 11b. In this case, the add-on parts 11a, 11b are formed such that they extend beyond the flange 3 in the direction of the center-of-gravity axis 8 (c.f. FIG. 1). Furthermore, the add-on parts 11a, 11b extend beyond the enclosure housing 1. In this case, it is provided in the present case that the add-on parts 11a, 11b extend beyond the enclosure housing 1 both above and below the end faces of the enclosure housing 1 in the direction of the center-of-gravity axis 8.

Figure 3:
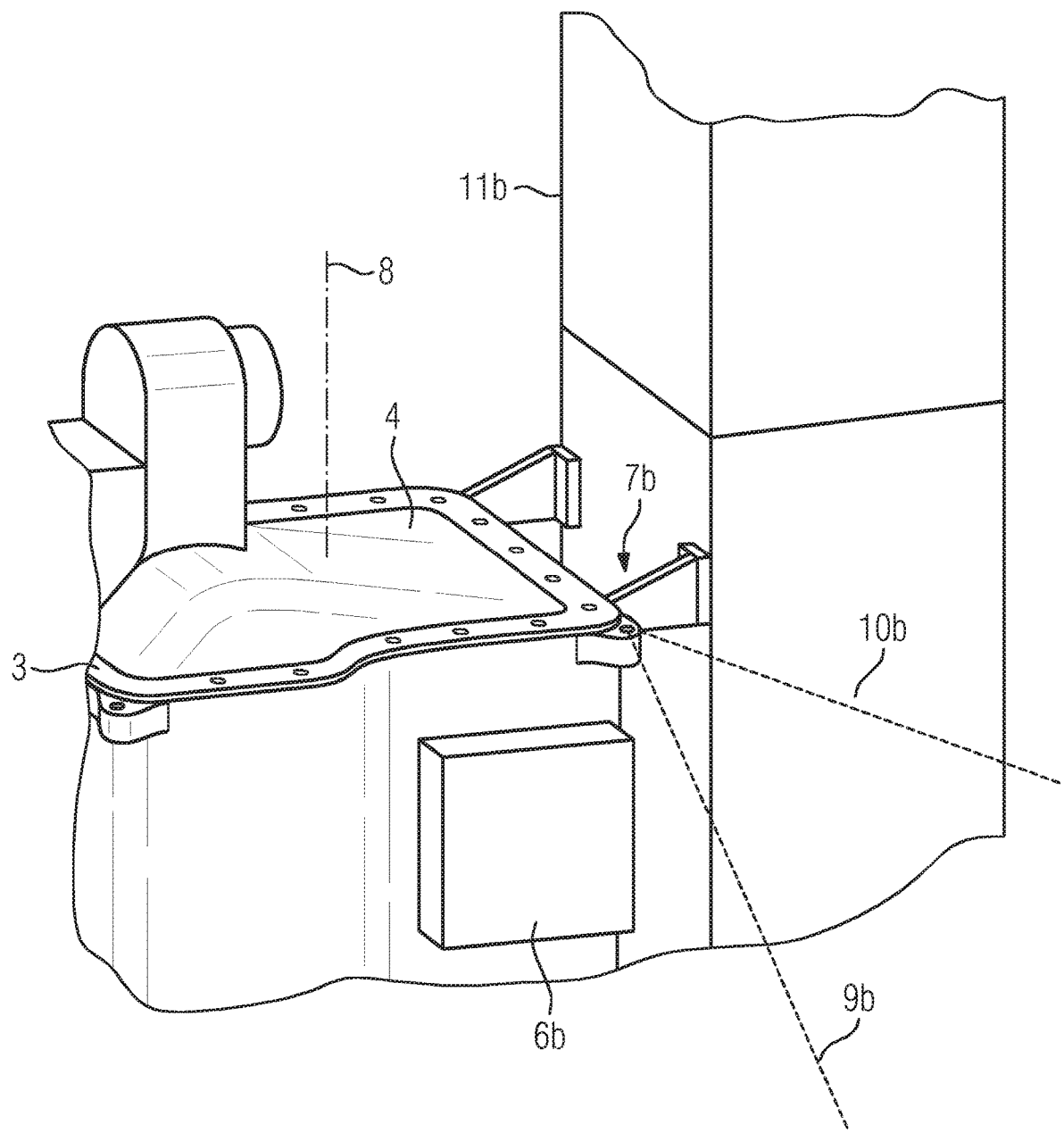
FIG. 3 a perspective view of an anchoring point.

FIG. 3 shows a detail of the second anchoring point 7b, which is representative of all anchoring points 7a, 7b, 7c, 7d. The second anchoring point 7b is arranged laterally on the enclosure housing 1, axially spaced from the flange 3 in relation to the center-of-gravity axis 8. In the present case, the anchoring point 7b is connected to the enclosure housing 1 with material fit. For example, when casting the enclosure housing 1, an anchoring point 7a, 7b, 7c, 7d can be formed therewith during the casting procedure. In the present case, the second anchoring point 7b is arranged axially spaced from the flange 3 in the direction of the center-of-gravity axis 8. The anchoring points 7a, 7b, 7c, 7d are preferably arranged such that they are located in a plane which is aligned substantially perpendicular to the center-of-gravity axis 8. However, it can alternatively also be provided that the anchoring points 7a, 7b, 7c, 7d are located in the flange 3 as part of the flange 3 or are formed at least partially by the flange 3. In this case, the anchoring points 7a, 7b, 7c, 7d are arranged preferably symmetrically, distributed along the circumferential extent of the flange 3. Anchoring points 7a, 7b, 7c, 7d can preferably be arranged diametrically opposed in each case, so that uniform anchoring of the switchgear is possible. Starting from the anchoring points 7a, 7b, 7c, 7d, anchoring preferably takes place in the direction of the respective mounting surface 2, wherein the individual forces are preferably conducted diversely into the anchoring points 7a, 7b, 7c, 7d on a parallel to the center-of-gravity axis 8. All in all, an anchoring direction in the direction of the center-of-gravity axis 8 is preferably realized. In this case, a series of clamping straps, for example, is preferably provided in each case in a sector which is enclosed between the respective connecting axes 9a, 9b and the respective planes 10a, 10b, 10c, 10d, as seen in the direction of the center-of-gravity axis 8. Under the sum of the anchoring forces acting on the anchoring points 7a, 7b, 7c, 7d, the enclosure housing 1 is pressed against the mounting surface 2 in the direction of the center-of-gravity axis 8 by the end face on which the flange 3 is arranged. In this case, the center of gravity of the switchgear is located below the plane in which the anchoring points 7a, 7b, 7c, 7d are located. The center of gravity, as seen in the direction of the center-of-gravity axis 8, is furthermore arranged within an area enclosed by the anchoring points 7a, 7b, 7c, 7d. Accordingly, owing to the accessibility of the anchoring points 7a, 7b, 7c, 7d, from the direction opposite the mounting surface 2, provision can also be made for access via crane means, so that lifting of the switching system is also possible by way of the anchoring points 7a, 7b, 7c, 7d. In the present case, the anchoring points 7a, 7b, 7c, 7d are provided with a through bore in which, for example, eyes, hooks, bolts, etc. can be positioned in order to enable forces to act reliably on the anchoring points 7a, 7b, 7c, 7d by way of stop means.

LIST OF REFERENCE SIGNS

1 Enclosure housing
2 Mounting surface
3 Flange
4 Flange cover
5 Drive device
6a, 6b, 6c, 6d Further drive devices
7a First anchoring point
7b Second anchoring point
7c Third anchoring point
7d Fourth anchoring point
8 Center-of-gravity axis
9a, 9b Connecting axis
10a, 10b, 10c, 10d Plane
11a, 11b Add-on part

The invention claimed is:

1. A switchgear, comprising:
an enclosure housing; and
a plurality of anchoring points disposed on said enclosure housing, said anchoring points being arranged such that a center of gravity of the switchgear is located below said anchoring points in an anchoring direction, said anchoring points projecting externally of said housing for mounting the switchgear to a mounting structure disposed lateral to said housing.

2. The switchgear according to claim 1, wherein said enclosure housing has a flange and said anchoring points project beyond a circumference of said flange.

3. The switchgear according to claim 2, wherein said anchoring points are arranged axially offset with respect to said flange.

4. The switchgear according to claim 1, further comprising add-on parts laterally supported on said enclosure housing, between two said anchoring points.

5. The switchgear according to claim 4, wherein said add-on parts are arranged laterally on said enclosure housing on opposite sides of said enclosure housing, in each case between said two anchoring points.

6. The switchgear according to claim 5, wherein said add-on parts extend beyond anchoring points in the anchoring direction.

7. The switchgear according to claim 1, further comprising add-on parts arranged laterally on said enclosure housing on opposite sides of said enclosure housing, in each case between two said anchoring points.

8. The switchgear according to claim 7, wherein said add-on parts extend beyond anchoring points in the anchoring direction.

9. The switchgear according to claim 2, wherein said flange forms an end-face termination of said enclosure housing above a mounting surface.

10. A switchgear, comprising:
an enclosure housing having a flange; and
a plurality of anchoring points disposed on said enclosure housing, said anchoring points being arranged such that a center of gravity of the switchgear is located below said anchoring points in an anchoring direction, said anchoring points project beyond a circumference of said flange, said flange being closed by a gear cover.

11. The switchgear according to claim 2, further comprising a drive device for mutually relatively movable switching contacts of the switchgear supported on said flange.

12. A switchgear, comprising:
an enclosure housing; and
a plurality of anchoring points disposed on said enclosure housing, said anchoring points being arranged such that a center of gravity of the switchgear is located below said anchoring points in an anchoring direction, said enclosure housing being a pressurized vessel.

13. The switchgear according to claim 2, wherein said flange circumferentially surrounds an opening of said housing.

14. The switchgear according to claim 13, wherein said anchoring points project externally of said housing from said flange.

15. The switchgear according to claim 13, further comprising a gear cover fastened to said flange for fluidically sealing said opening of said housing.

16. The switchgear according to claim 1, further comprising a gear cover fastened to said housing for fluidically sealing an opening of said housing.

17. The switchgear according to claim 10, wherein said enclosure housing is a pressurized vessel.

18. The switchgear according to claim 10, further wherein said gear cover is fastened to said housing for fluidically sealing an opening of said housing.

* * * * *